United States Patent
Willmeroth et al.

(10) Patent No.: US 7,910,983 B2
(45) Date of Patent: Mar. 22, 2011

(54) MOS TRANSISTOR HAVING AN INCREASED GATE-DRAIN CAPACITANCE

(75) Inventors: Armin Willmeroth, Augsburg (DE); Michael Treu, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/241,947

(22) Filed: Sep. 30, 2008

(65) Prior Publication Data

US 2010/0078708 A1    Apr. 1, 2010

(51) Int. Cl.
*H01L 29/78* (2006.01)

(52) U.S. Cl. ........ 257/328; 257/139; 257/296; 257/330; 257/E27.078; 257/E27.095; 257/E29.118; 257/E29.274; 257/E29.313; 257/E29.318; 257/E21.141; 257/E21.629; 257/E21.643; 257/E21.577; 257/E21.578; 438/141; 438/238; 438/239; 438/259; 438/270; 438/271; 438/589

(58) Field of Classification Search .................. 257/139, 257/296, 330, 341, E21.41, E21.385, E29.198, 257/135, 136, 242, E27.091, E29.118; 438/141, 438/238, 239, 259, 270, 271, 589
See application file for complete search history.

(56) References Cited

U.S. PATENT DOCUMENTS

| | | | |
|---|---|---|---|
| 4,941,026 A | 7/1990 | Temple | |
| 5,047,813 A | 9/1991 | Harada | |
| 5,072,266 A | 12/1991 | Bulucea et al. | |
| 5,747,851 A | 5/1998 | Tomatsu et al. | |
| 5,973,360 A | 10/1999 | Tihanyi | |
| 6,303,410 B1 | 10/2001 | Baliga | |
| 2005/0133858 A1* | 6/2005 | Banerjee et al. | 257/327 |
| 2007/0114602 A1* | 5/2007 | Saito et al. | 257/330 |
| 2008/0135930 A1* | 6/2008 | Saito | 257/330 |
| 2008/0283913 A1* | 11/2008 | Shibata | 257/341 |

FOREIGN PATENT DOCUMENTS

| | | |
|---|---|---|
| EP | 0119400 B1 | 8/1987 |
| EP | 0837508 A2 | 4/1998 |

* cited by examiner

*Primary Examiner* — Benjamin P Sandvik
*Assistant Examiner* — Farid Khan
(74) *Attorney, Agent, or Firm* — Dicke, Billig & Czaja, PLLC

(57) ABSTRACT

A MOS transistor having an increased gate-drain capacitance is described. One embodiment provides a drift zone of a first conduction type. At least one transistor cell has a body zone, a source zone separated from the drift zone by the body zone, and a gate electrode, which is arranged adjacent to the body zone and which is dielectrically insulated from the body zone by a gate dielectric. At least one compensation zone of the first conduction type is arranged in the drift zone. At least one feedback electrode is arranged at a distance from the body zone, which is dielectrically insulated from the drift zone by a feedback dielectric and which is electrically conductively connected to the gate electrode.

6 Claims, 9 Drawing Sheets

MOS TRANSISTOR HAVING AN INCREASED GATE-DRAIN CAPACITANCE

BACKGROUND

MOS transistors, such as e.g. MOSFETs or IGBTs, can be used as electronic switches for switching electrical loads. Such MOS transistors suitable for switching electrical loads are also referred to as power MOS transistors. One aim in the development of these MOS transistors is to achieve a lowest possible area-specific on resistance ($R_{ON} \cdot A$) for a given dielectric strength. This area-specific on resistance is the product of the ohmic resistance ($R_{ON}$) of the transistor in the on state and the chip area (A) required for realizing the transistor.

Power transistors have a drift zone, in which a space charge zone or depletion layer zone can propagate when the component is turned off and a reverse voltage is present, and which in this way takes up the reverse voltage present. In the case of compensation components, a complementarily doped compensation zone is present in the drift zone, wherein the drift zone and the compensation zone are mutually depleted of charge carriers when the component is turned off. The provision of such a compensation zone permits a higher doping of the drift zone for the same dielectric strength. Relative to the on resistivity, this means that the on resistance ($R_{ON}$) can be reduced with the chip area (A) remaining the same, or that the chip area can be reduced with the on resistance remaining the same.

With reduction of the chip area and the associated reduction of the capacitances contained in the component, the switching behavior of the transistor changes to the effect that the transistor switches more rapidly, that is to say that when suitable drive signals are applied to a gate electrode, the transistor changes more rapidly from the on state to the off state or from the off state to the on state. Rapid switching is tantamount to steep edges of a voltage present across the transistor or the switched load or of a current flowing through the transistor and the load. Both steep voltage edges and steep current edges can be critical with regard to radiated electromagnetic interference. Furthermore, steep current edges in parasitic inductances can lead to high voltage spikes, and steep voltage edges in conjunction with parasitic capacitances can lead to undesirable oscillations.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a MOS transistor having a drift zone of a first conduction type; at least one transistor cell having a body zone, a source zone separated from the drift zone by the body zone, and a gate electrode, which is arranged adjacent to the body zone and which is dielectrically insulated from the body zone by a gate dielectric; at least one compensation zone of the first conduction type which is arranged in the drift zone; at least one feedback electrode, which is arranged at a distance from the body zone, which is dielectrically insulated from the drift zone by a feedback dielectric and which is electrically conductively connected to the gate electrode.

Figure 1:
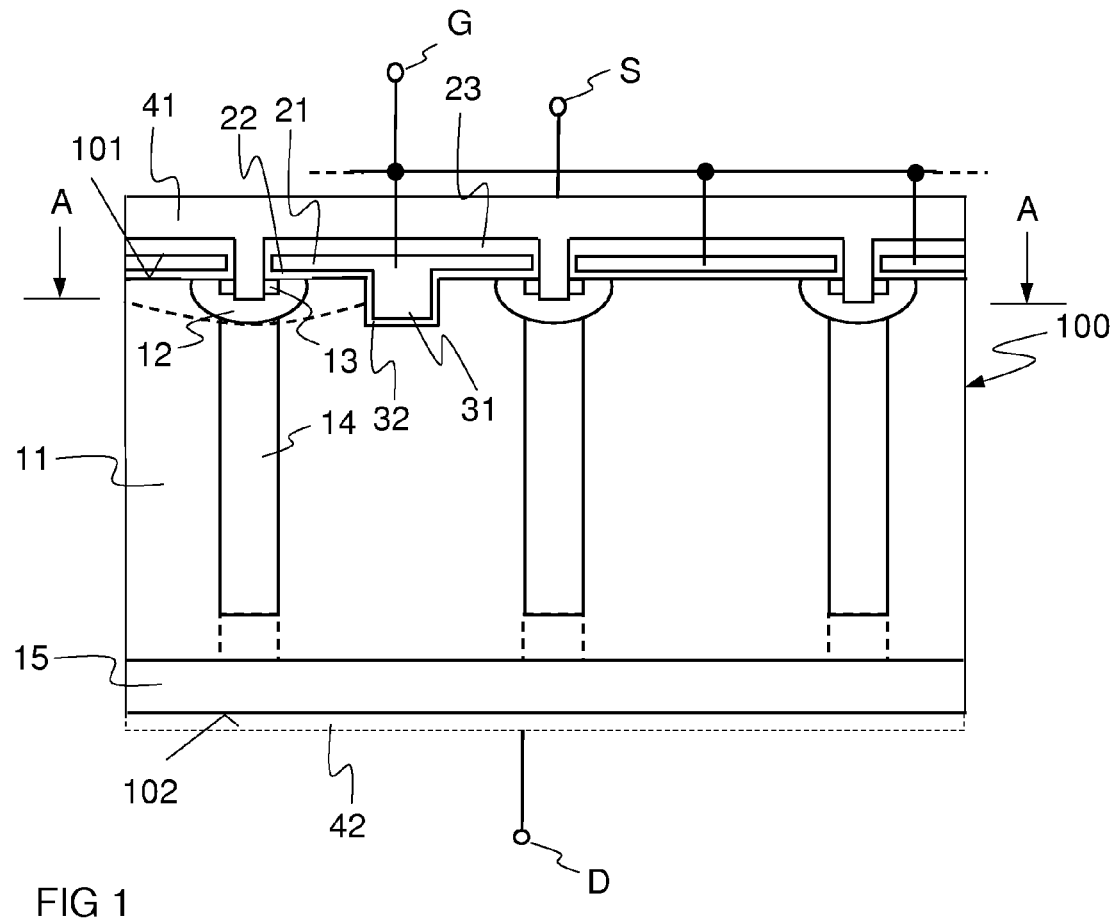
FIG. 1 illustrates, on the basis of a vertical cross section through a semiconductor body, one embodiment of a MOS transistor having a drift zone, a transistor cell arranged in the drift zone, a compensation zone arranged in the drift zone, and also a feedback electrode arranged in the drift zone.

FIG. 1 illustrates one embodiment of a MOS transistor. This MOS transistor includes a semiconductor body 100 having a first side 101, which is referred to hereinafter as front side, and a side 102 remote from the first side 101, the side 102 being referred to hereinafter as rear side. FIG. 1 illustrates a vertical cross section through this semiconductor body 100, that is to say a cross section in a sectional plane running perpendicular to the front and rear sides 101, 102.

The transistor has a drift zone 11 of a first conduction type arranged in the semiconductor body 100, and at least one transistor cell. The transistor cell includes a body zone 12, a source zone 13 arranged in the body zone 12, the source zone being separated from the drift zone 11 by the body zone 12. The body zone 12 is, for example, of a second conduction type, which is complementary to the first conduction type of the drift zone 11, while the source zone 13 is for example of the first conduction type. The MOS transistor is a normally off MOS transistor in this case. The transistor cell additionally includes a gate electrode 21, which is arranged adjacent to the body zone 12 and which is dielectrically insulated from the body zone 12 by a gate dielectric 22. The gate electrode 21 serves for controlling a conducting channel—which is an inversion channel in the case of a normally off transistor—in the body zone 12 between the source zone 13 and the drift zone 11. For this purpose, the gate electrode 21 extends adjacent to the body zone 12 from the source zone 13 as far as a section of the drift zone 11.

In the example illustrated, the gate electrode 21 is embodied as a planar gate electrode 21 arranged above the front side 101 of the semiconductor body 100. A transistor cell having such a planar gate electrode is also referred to as a planar transistor cell. In a manner not illustrated in more specific detail there is, of course, also the possibility of realizing the gate electrode with a different geometry, e.g., as a trench electrode, that is to say as a gate electrode arranged in a trench, which electrode extends in a vertical direction through the source zone 13 and the body zone 12 right into the drift zone 11.

Contact is made with the source zone 13 of the transistor cell by a source electrode 41, which also makes contact with the body zone 12 in the example illustrated and which therefore short-circuits the source zone 13 and the body zone 12. The source electrode 41 forms a source connection S of the transistor. The gate electrode 21 forms a gate connection G of the transistor and the drain zone 15 is connected to a drain connection D. The drain connection D can include a metallization 42 applied to the drain zone 15, the metallization being illustrated by dashed lines in FIG. 1. The MOS transistor can have a multiplicity of transistor cells of the same type. These transistor cells are connected in parallel by their source zones 13 being jointly connected to the source connection S and by their gate electrodes 21 being jointly connected to the gate connection G. In this case, the drift zone 11 and the drain zone 15 are common to all the transistor cells.

At least one compensation zone 14 doped complementarily with respect to the drift zone 11 is additionally provided in the drift zone 11. In the example illustrated, the compensation zone is connected to the body zone 12, but can also be arranged separately or at a distance from the body zone 12. The compensation zone 14 doped complementarily with respect to the drift zone 11 can—as illustrated—extend in a vertical direction of the semiconductor 100 and can in this case end at a distance from the drain zone 15 within the drift zone 11, but can—as is illustrated by dashed lines—also extend as far as the drain zone 15. Doping concentrations of the drift zone 11 and of the compensation zones 14 are coordinated with one another in one embodiment in such a way that these zones 11, 14 are mutually fully depleted of charge carriers when the component is turned off.

The transistor additionally has a feedback electrode 31, which is arranged in the drift zone 11 and which is dielectrically insulated from the drift zone 11 by a feedback dielectric 32. In the example illustrated, the feedback electrode 31 is arranged in a trench extending into the semiconductor body 100 in a vertical direction proceeding from the front side 101. In this case, the feedback electrode 31 is arranged in a section of the drift zone 11 which extends as far as the front side 101. The feedback electrode 31 is electrically conductively connected to the gate electrode 21. In this case—as illustrated in FIG. 1—the feedback electrode 31 and the gate electrode 21 can be realized integrally as a common electrode. An electrically conductive connection between the feedback electrode 31 and the gate electrode 21 can, of course, also be realized in any other manner desired. In the former case, the feedback electrode 31 can be produced by the same method processes by which the gate electrode 21 is produced. The gate electrode 21 and the feedback electrode 31 are composed, for example, of a doped polycrystalline semiconductor material, such as e.g., polysilicon. The semiconductor body 100 is composed for example of silicon.

The feedback electrode 31 and the feedback dielectric 32 surrounding the feedback electrode 31 can be arranged at a distance from the body zone 12 in a lateral direction of the semiconductor body. In this case, a section of the drift zone 11 is present between the body zone 12 and the feedback dielectric 32. However, the body zone can also reach as far as the feedback dielectric in a lateral direction, which is illustrated by dashed lines for a transistor cell in the left-hand part of the figure. In this case, the conducting channel (inversion channel), when the component is driven in the on state, extends from the source zone 13 along the gate dielectric 22 and the feedback dielectric 32 right into the drift zone. In this case, too, a threshold voltage of the component is defined at the source-side end of the channel, that is to say in the region in which the gate electrode 21 is arranged.

At a side of the drift zone 11 which is remote from the transistor cell, a drain zone 15 is adjacent to the drift zone 11. In the case of a transistor embodied as a MOSFET, the drain zone 15 is of the same conduction type as the drift zone 11, but doped more highly, and, in the case of a MOS transistor embodied as an IGBT, is doped complementarily with respect to the drift zone 11. In the case of an IGBT, a field stop zone (not illustrated) can be present between the drain zone 15 and the drift zone 11, the field stop zone being of the same conduction type as the drift zone 11 but doped more highly. The field stop zone can be directly adjacent to the drain zone 15, but can also be arranged at a distance from the drain zone 15.

In the case of an n-conducting MOSFET, the drift zone 11 and the source zone 13 are n-doped, while the body zone 12 and the compensation zone 14 are p-doped. In the case of a p-conducting MOSFET, these component zones are correspondingly doped complementarily. The doping concentration of the drift zone 11 lies for example within the range of between $10^{12}$ cm$^{-3}$ and $10^{17}$ cm$^{-3}$, the doping concentration of the body zone 12 lies for example within the range of between $10^{16}$ cm$^{-3}$ and $10^{18}$ cm$^{-3}$, the doping concentration of the source zone 13 lies for example within the range of between $10^{18}$ cm$^{-3}$ and $10^{20}$ cm$^{-3}$, and the doping concentration of the drain zone 15 lies for example within the range of between $10^{17}$ cm$^{-3}$ and $10^{20}$ cm$^{-3}$.

The component illustrated in FIG. 1 is realized as a vertical component, that is to say that a main current flow direction of this component runs in a vertical direction of the semiconductor body. It should be noted in this connection that the drain zone 15 need not necessarily be adjacent to the rear side 102 of the semiconductor body 100. In a manner not illustrated in more specific detail there is also the possibility of realizing the drain zone 15 as a buried layer within the semiconductor body and of making contact with this drain zone via the front side 101 by a doped connection zone being led from the front side 101 as far as the buried drain zone at the edge of a cell array containing the transistor cell.

The feedback dielectric 32 can—as illustrated—form together with the gate dielectric 22 a continuous dielectric layer, and that is to say that the feedback dielectric 32 and the gate dielectric can be identical with regard to the material composition and the thickness. In this case, the feedback dielectric 32 can be produced by the same method processes by which the gate dialectic 22 is produced.

Figure 2:
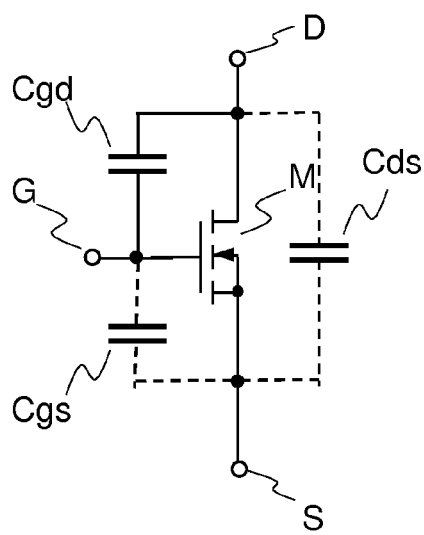
FIG. 2 illustrates one embodiment of an electrical equivalent circuit diagram of the MOS transistor.

FIG. 2 illustrates the electrical equivalent circuit diagram of the MOS transistor illustrated in FIG. 1. For explanation purposes it shall be assumed that this MOS transistor is a normally off n-conducting MOSFET. However, the explanations below are correspondingly applicable to other MOS transistors as well. The equivalent circuit diagram illustrates not only the actual transistor M but also its gate-source capacitance Cgs, which is present between the gate connection G and the source connection S, its gate-drain capacitance Cgd, which is also referred to as feedback capacitance and which is present between the gate connection G and the drain connection D, and also its drain-source capacitance Cds, which is present between the drain connection D and the source connection S. The switching behavior of the MOS transistor is dependent on these capacitances Cgs, Cgd, Cds. In the case of the component illustrated in FIG. 1, the feedback capacitance Cgd is enlarged in a targeted manner by providing the feedback electrode 31. This is because the feedback electrode 31 connected to the gate electrode 21 forms, together with the feedback dielectric 32 and the drift zone 11, a capacitance between the gate connection G and the drain connection D of the component. A change in the gate-drain capacitance is also accompanied by a change in the output capacitance Coss of the component, which corresponds to the sum of the gate-drain capacitance Cgd and the drain-source capacitance. The gate-source capacitance Cgs is not influenced by the feedback electrode. The gate-source capacitance Cgs and the drain-source capacitance Cds are not considered in any further detail below and are therefore illustrated by dashed lines in FIG. 2.

By enlarging the feedback electrode Cgd, the switching speed of the MOS transistor can be slowed down with otherwise identical component properties, that is to say with identical doping relations, with an identical number of transistor cells, with an identical gate-source capacitance Cgs, with an identical output capacitance Coss, etc. the feedback capacitance Cgd has to be subjected to charge reversal during each switching operation of the transistor, that is to say during each transition from the on state to the off state and from the off state to the on state. For a given charging current flowing onto the gate electrode G in the case of driving in the on state and for a given discharge current flowing from the gate electrode G in the case of driving in the off state, this charge-reversal operation lasts all the longer, the larger the gate-drain capacitance Cgd.

The feedback capacitance Cgd of the MOS transistor can be set in a targeted manner by using the number of feedback electrodes 31 provided, and also by using the dimensions thereof in horizontal and vertical directions. For the rest, the component behaves like a conventional MOS transistor and is turned on if an electrical potential suitable for forming a conducting channel in the body zone 12 between the source zone 13 and the drift zone 11 is present at the gate electrode G, and is turned off if such an electrical potential suitable for forming a conducting channel is not present at the gate electrode 21.

Figure 3:
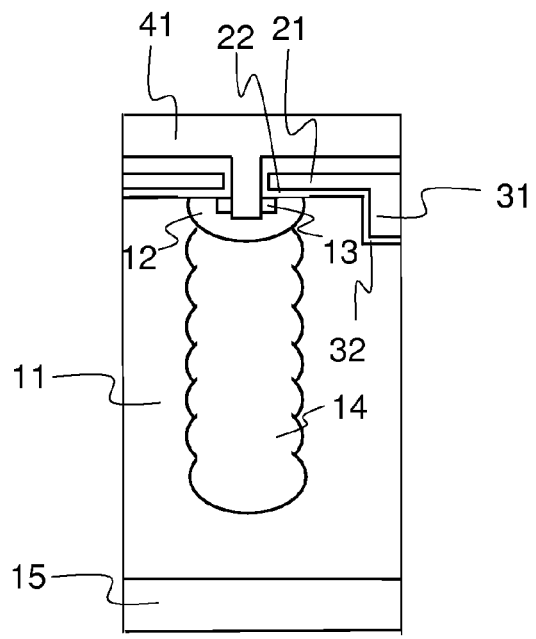
FIG. 3 illustrates one embodiment of a compensation zone modified by comparison with the embodiment in FIG. 1.

The compensation zone 14 is schematically illustrated in FIG. 1 as a pillar extending in a vertical direction of the semiconductor body 100. It should be noted that the compensation zone 14 need not necessarily have the geometry of a straight pillar, and that a pn-junction in-between this compensation zone 14 and the surrounding drift zone 11 can have any desired geometry. FIG. 3 illustrates one embodiment of a compensation zone 14 in which a pn-junction between the compensation zone 14 and the drift zone 11 does not form a planar area. The compensation zone 14 illustrated in FIG. 3 can be effected for example by a plurality of successive implantation and/or diffusion processes during epitaxial production of the drift zone 11.

When the component is turned off, that is to say when a voltage is present between the drain connection D and the source connection S but an electrical potential suitable for forming a conducting channel in the body zone 12 is not present at the gate electrode G, a space charge zone propagates proceeding from the pn-junctions between the body zone 12 and compensation zone 14, on the one hand, and the drift zone 11, on the other hand. An electric field accompanying the space charge zone can have field spikes in the region of the feedback electrode 31 or of the feedback dielectric 32 unless additional measures are taken.

Such a field boosting can arise as a result of the fact that when the component is turned off, the feedback electrode 31 is at a lower electrical potential than the surrounding regions of the drift zone 11, such that a space charge zone propagates in the drift zone 11 proceeding from the feedback dielectric 32. In order to avoid such field increases or field spikes in the region of the feedback electrode 31, in one example provision is made for locally altering the degree of compensation in a region of the semiconductor body in which the feedback electrode 31 is arranged, to be precise in favor of charge carriers of the conduction type of the body zone 12 or of the compensation zone 14. The degree of compensation of the component in the region into which the feedback electrode 31 is arranged is dependent on a ratio of the dopant charges in the region, of the drift zone 11, in which the feedback electrode 31 is arranged and the dopant charges in those regions of the body zone 12 and of the compensation zone 14 which are adjacent to this section of the drift zone 11 in a lateral direction.

Figure 4:
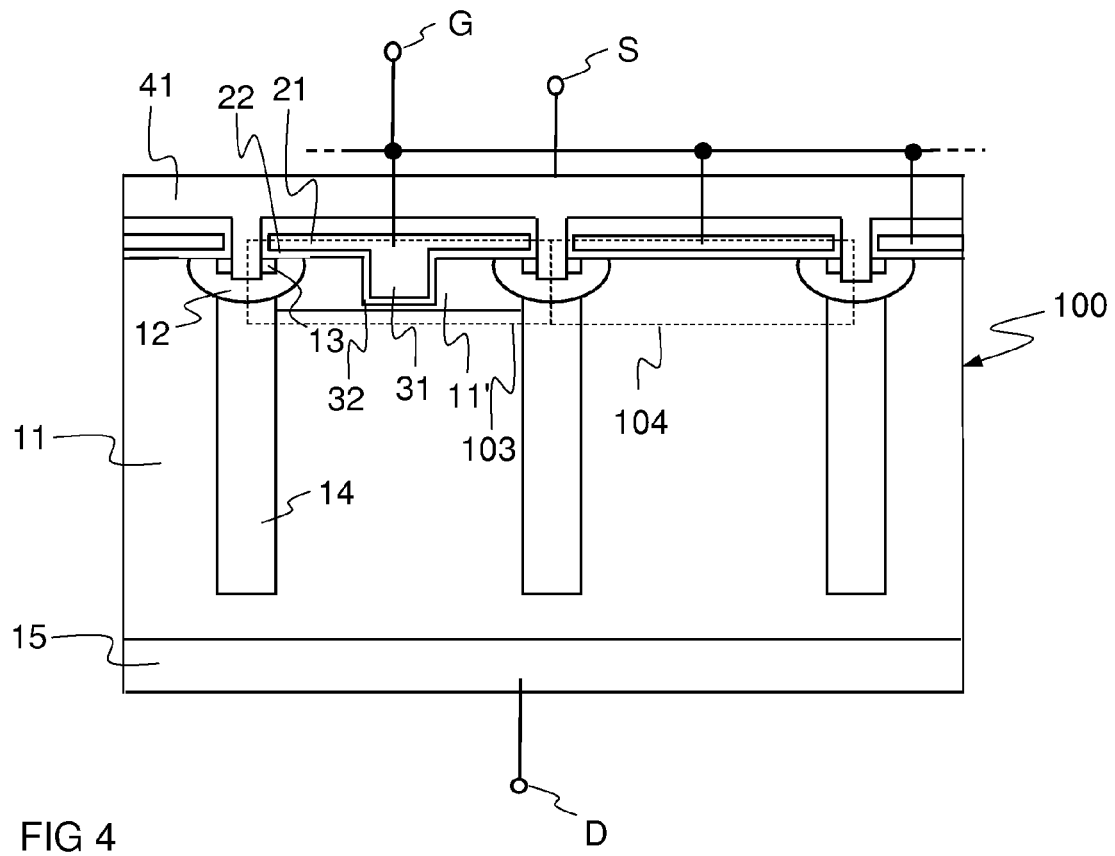
FIG. 4 illustrates one embodiment of a MOS transistor in which an effective doping concentration of the drift zone is locally reduced in the region of the feedback electrode.

Referring to FIG. 4, in one example provision is made for the drift zone 11 to be more lightly doped in a section 11' in which the feedback electrode 31 is arranged than in remaining regions of the drift zone 11. Such a local reduction of the doping concentration of the drift zone 11 can be achieved, for example, by virtue of the fact that during the method for producing the semiconductor component, dopant atoms of a conduction type complementary to the conduction type of the drift zone 11 are implanted and/or indiffused into the section 11' of the drift zone, which results in a reduction of the effective doping concentration in the section 11' of the drift zone 11. For further explanation, consideration shall be given to a section 103 of the semiconductor body 100 which includes the section of the drift zone 11 in which the feedback electrode 31 is arranged and also sections of the body zone 12 and of the compensation zone 14 which adjoins the section in a lateral direction. The degree of compensation for this section 103 of the semiconductor body is defined as $$k = \frac{D-A}{D}. \tag{1}$$

In this case, D denotes the number of dopant atoms of the first conduction type, that is to say of the conduction type of the drift zone 11 in this section 103 of the semiconductor body, and A denotes the number of dopant atoms of the second conduction type, that is to say of the conduction type of the body zone 12 and of the compensation zone 14, in this section 103 of the semiconductor body 100. A local shift in the degree of compensation in favor of dopant atoms of the second conduction type means that more dopant atoms of the second conduction type are present in this section 103 than in a comparative section 104. The comparative section 104 is identical to the section 103 with regard to its dimensions and with regard to the dimensions of the sections of the body zone 12, of the compensation zone 14 and of the drift zone 11 that are contained in it, but differs in that no feedback electrode 31 is present in the section 104. This comparative section 104 accordingly does not contain a section 11' of the drift zone 11 in which the doping concentration is locally reduced.

Figure 5:
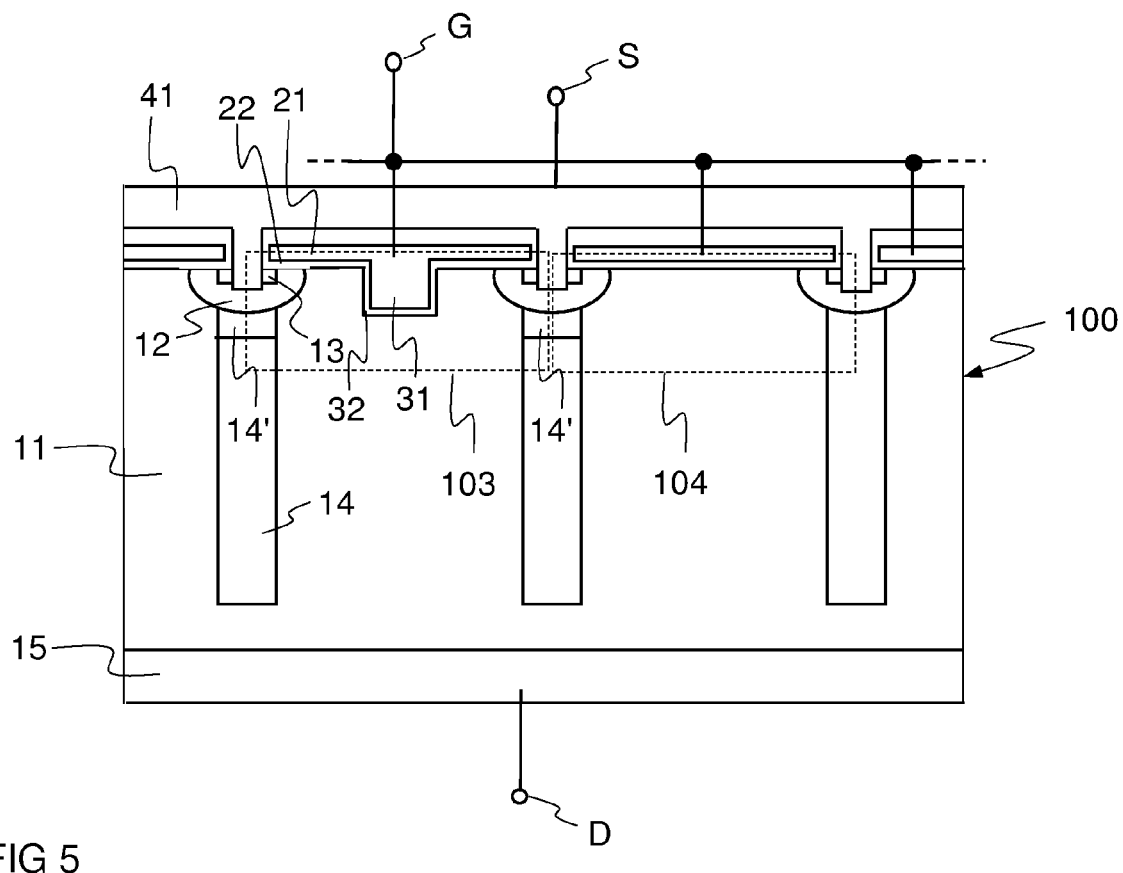
FIG. 5 illustrates one embodiment of a MOS transistor in which the compensation zone has a more highly doped section in the region of the feedback electrode.

FIG. 5 illustrates a further embodiment for locally changing the degree of compensation. In this example, provision is made for the compensation zone 14 to be doped more highly in sections in those regions which are adjacent to a drift zone section in which the feedback electrode 31 is arranged. In FIG. 5, the reference symbol 14 designates such a more highly doped section of the compensation zone which is doped more highly than remaining sections of the compensation zone 14. In the example illustrated, this more highly doped section 14' of the compensation zone is directly adjacent to the body zone 12, but can also reach right into the body zone 12 (not illustrated).

Figure 6A:
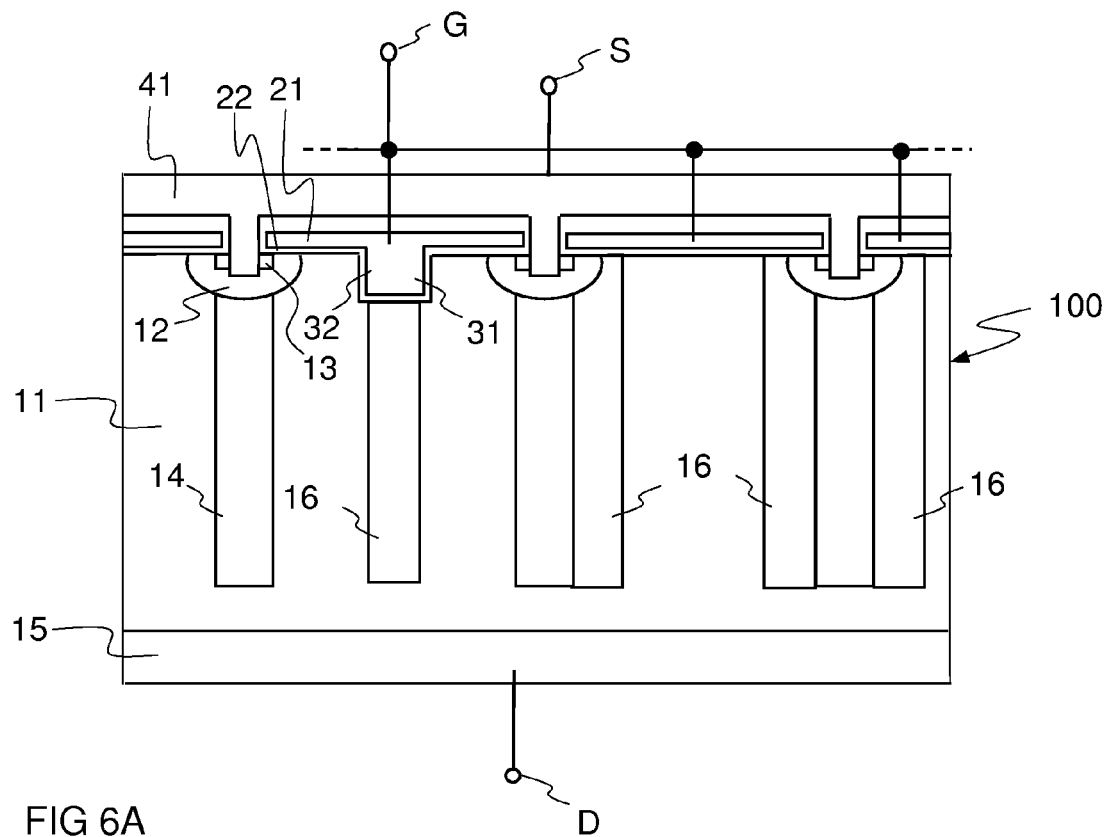
FIG. 6 illustrates one embodiment of a MOS transistor in which the drift zone has more highly doped and more lightly doped sections, and in which the feedback electrode is arranged in extension of a more highly doped section.

Referring to FIG. 6A, in a further embodiment of the MOS transistor, the drift zone 11 has doped drift zone sections 16 which are of the same conduction type as remaining sections of the drift zone 11 but are doped more highly. These more highly doped drift zone sections 16 run, at least in sections, parallel to the compensation zones 14 and can be arranged at a distance from the compensation zones 14 in a lateral direction, but can also be directly adjacent to the body zones 14. The right-hand part of FIG. 6A illustrates an example in which the more highly doped drift zone sections 16 are directly adjacent to the compensation zones 14. In this case, the more highly doped drift zone sections 16 can be arranged in such a way that the inversion channels that form in the body zones 12 when the component is turned on run into the more highly doped drift zone sections 16.

Figure 6B:
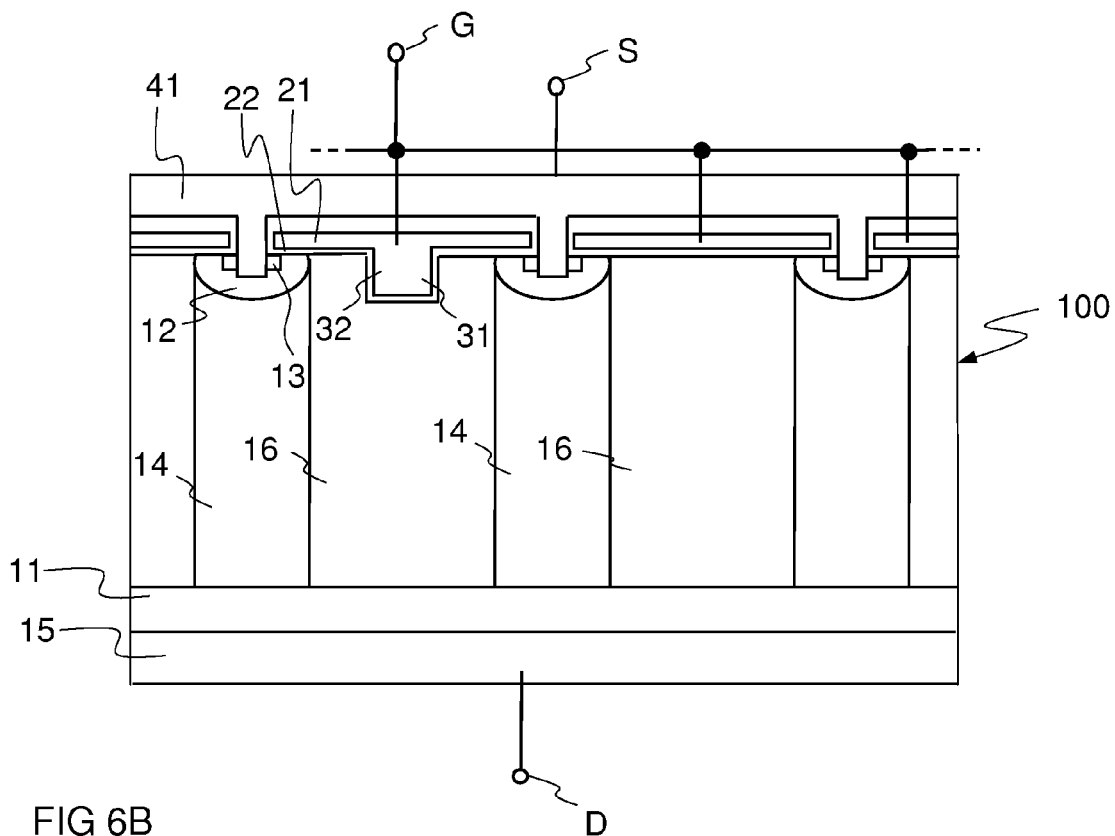

Referring to FIG. 6B, in a further embodiment, the more highly doped drift zone sections 16 and the compensation zones 14 are arranged in such a way that they alternate in a horizontal direction of the semiconductor body 100. In this case, a more lightly doped drift zone section 11 is only present in a section adjoining the drain zone 15.

In those regions of the MOS transistor in which a feedback electrode 31 is arranged, the feedback electrode 31 is arranged directly in extension of the more highly doped drift zone section 16. In this case, more highly doped drift zone sections 11' which are not arranged adjacent to a feedback electrode 31 extend further in a direction of the front side 101 where the more highly doped drift zone 11' which are arranged adjacent to a feedback electrode 31. This automatically results in a local variation of the degree of compensation in favor of dopant atoms of the conduction type of the body zone 12 and of the compensation zone 14 in those regions of the component in which a feedback electrode 31 is arranged.

The individual transistor cells of the MOS transistor can have any desired transistor cell geometry. Furthermore, the feedback electrodes 31 can be assigned to individual transistor cells in principle completely as desired. In other words: the ratio between a number of transistor cells and a number of feedback electrodes present in the component can be chosen completely as desired in order thereby to set the feedback capacitance (Cgd in FIG. 2) to a desired value. Moreover, the geometry of the transistor cells can be independent of the geometry of the feedback electrodes.

Figure 7:
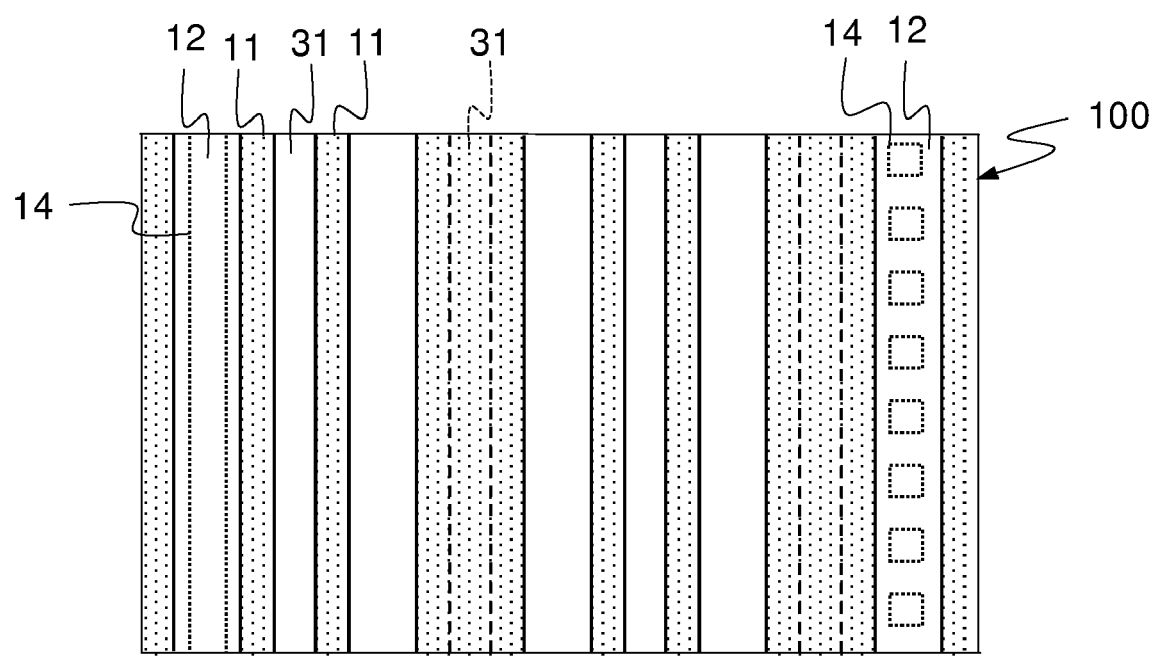
FIG. 7 illustrates on the basis of a horizontal cross section through a semiconductor body, one embodiment of a MOS transistor having strip-type transistor cells.

FIG. 7 illustrates one embodiment of a MOS transistor having strip-type transistor cells, on the basis of a horizontal cross section through the semiconductor body 100. FIG. 7 illustrates a cross section of the component in a sectional plane A-A that is illustrated in FIG. 1 and runs below the source zone 13 through the body zones 12. Source zones of the individual transistor cells are therefore not illustrated in FIG. 7. The compensation zones 14 arranged below the body zones 12 are illustrated by dotted liens for individual transistor cells in FIG. 7.

In the case of the component illustrated in FIG. 7, the body zones 12—and accordingly the source zones 13 not illustrated—form elongated strips in a horizontal direction of the semiconductor body 100. Referring to FIG. 7, the feedback electrode 31 can likewise be embodied in strip-type fashion and be arranged between the body zones 12 of two adjacent strip-type transistor cells. In this case, a feedback electrode 31 can be assigned to each of the transistor cells. In this case, transistor cells and feedback electrodes 31 are arranged alongside one another alternately in the drift zone 11, in the manner as illustrated by dashed lines in FIG. 7. Furthermore there is also the possibility of assigning feedback electrodes 31 only to individual transistor cells from among the transistor cells, wherein the ratio $k=n_R/n_T$ between the number $n_R$ of feedback electrodes 31 and the number $n_T$ of transistor cells is less than 1 if the transistor cells and the feedback electrodes have an identical geometry. Thus, there is the possibility, for example, of assigning a feedback electrode 31 only to every n-th (where n>1) transistor cell, such that $k=1/n$ holds true. Furthermore, the feedback electrodes can also be arranged in a manner distributed as desired, for a given ratio of k<1. Thus, by way of example, transistor cells and feedback electrodes can alternate in some regions, while a plurality of transistor cells are arranged directly adjacent to one another in other regions.

It should be noted that a transistor cell in connection with the present description should be understood to mean an arrangement including a body zone, a source zone and a gate electrode—or a gate electrode section—which has a continuous body zone or whose body zone is delimited toward all sides in the semiconductor body by the drift zone 11 of the compensation zone 14.

The compensation zones 14 arranged below the body zones 12 can be embodied in strip-type fashion in a manner corresponding to the geometry of the body zones 12, as is illustrated for a transistor cell in the left-hand part of FIG. 7. Furthermore, the compensation zones 14 can also have a geometry that deviates from the geometry of the body zone 12. Thus, by way of example, a plurality of pillar-type compensation zone 14 can be arranged below a strip-type body zone 12 as is illustrated for a transistor cell in the right-hand part of FIG. 7. In this case, the pillars can have any desired geometry with regard to their perimeter and can be e.g., square (as illustrated), oval, circular, hexagonal, or polygonal in any desired fashion.

Optionally, more highly doped drift zone sections 16 (not illustrated in FIG. 7) are present below the feedback electrodes 31. These more highly doped drift zone sections can be in strip form in a manner corresponding to the geometry of the feedback electrodes 31 but can also have a geometry that deviates from the geometry of the feedback electrode 31.

Thus, by way of example, there is the possibility of providing a plurality of pillar-type more highly doped drift zone sections below a strip-type feedback electrode 32. In this case, the pillars can have any desired geometry with regard to their parameter and can be e.g., square (as illustrated), oval, circular, hexagonal, or polygonal in any desired fashion.

Figure 8:
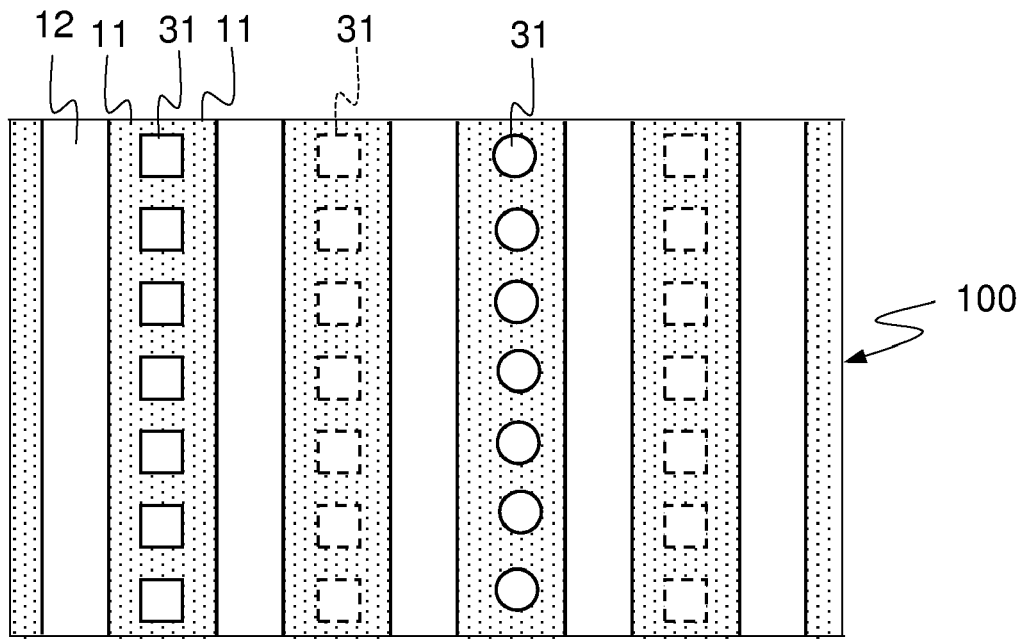
FIG. 8 illustrates, on the basis of a horizontal cross-section through a semiconductor body, one embodiment of a MOS transistor having strip-type transistor cells.

In the case of the component illustrated in FIG. 7, the transistor cells and the feedback electrodes 31 have an identical geometry, namely a strip-type geometry in the example. However, the geometry of the transistor cells and the geometry of the feedback electrodes can be chosen independently of one another. Referring to FIG. 8, which illustrates a further example of a MOS transistor on the basis of a horizontal cross section through a semiconductor body 100, there is the possibility, for example, of realizing the transistor cells as strip-type transistor cells in accordance with the example explained with reference to FIG. 7, but of realizing the feedback electrodes 31 as pillar-type electrodes having a rectangular, round or oval cross section. In this case, a number of such pillar-type feedback electrodes 31 can be assigned to each transistor cell, as is illustrated using solid and dashed liens in FIG. 8. Furthermore, there is also the possibility of assigning such pillar-type feedback electrodes 31 only to some of the transistors cells, as is illustrated on the basis of solid lines for the feedback electrodes 31 in FIG. 8. Thus, by way of example, in accordance with the example explained above with reference to FIG. 7b, there is the possibility of assigning a number of feedback electrodes 31 only to every n-th (where n>1) transistor cell.

In a manner not illustrated in more specific detail, it is possible to provide compensation zones 14 below the body zones 12 and more highly doped drift zone sections 11' below the feedback electrodes 31. These compensations zones 14 and more highly doped drift zone sections 11' can be realized, for example, in strip form or in pillar form.

In the case of the component illustrated in FIG. 8, the feedback capacitance Cgd can be set by way of the number of pillar-type feedback electrodes 31. In this case, the feedback electrodes can be distributed as desired among drift zone sections arranged between the transistor cells. In this case, the number of feedback electrodes 31 can be set by way of the number of drift zone sections in which feedback electrodes are realized, and can furthermore be set by way of the mutual distance between the feedback electrodes 31. It holds true here that the feedback capacitance Cgd is all the higher, the more drift zone sections with feedback electrodes are present and the smaller the distance between the individual feedback electrodes.

Figure 9:
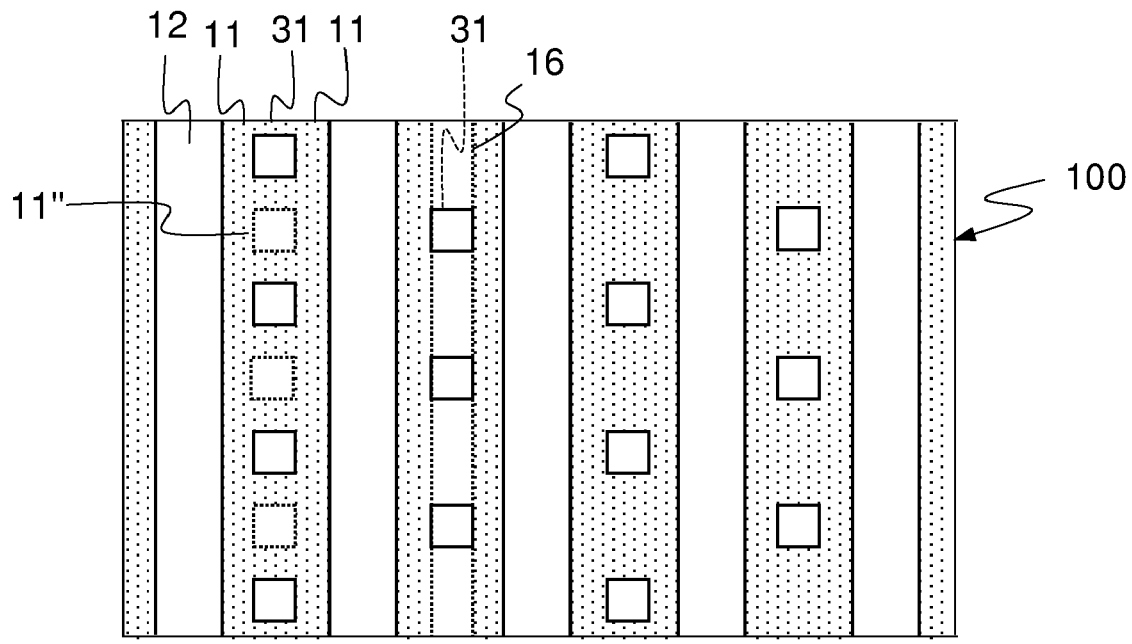
FIG. 9 illustrates a further example of a MOS transistor having strip-type transistor cells.

FIG. 9 illustrates an example of a MOS transistor in which a plurality of pillar-type feedback electrodes are assigned to each transistor cell 12, that is to say in which pillar-type feedback electrodes 31 are arranged in each drift zone section between two adjacent body zones 12. In this case, the feedback capacitance Cgd is set by way of the number of feedback electrodes that are respectively assigned to a transistor cell, or by way of the mutual distance between the feedback electrodes 31. As already explained, more highly doped drift zone sections 11' can be arranged below the feedback electrodes 31. The more highly doped drift zone sections can have a pillar-type geometry, as is illustrated in the left-hand part of FIG. 9, wherein in those regions in which no feedback electrode is arranged, the more highly doped drift zone sections 11' can reach the front side of the semiconductor body. The more highly doped drift zone sections 11' can also be realized in strip-type fashion, as is illustrated in the right-hand part of FIG. 9. In this case, the more highly doped drift zone sections 11' reach between the pillar-type feedback electrodes 31 to the level of the feedback electrodes 31 or as far as the front side 101 of the semiconductor body.

Figure 10:
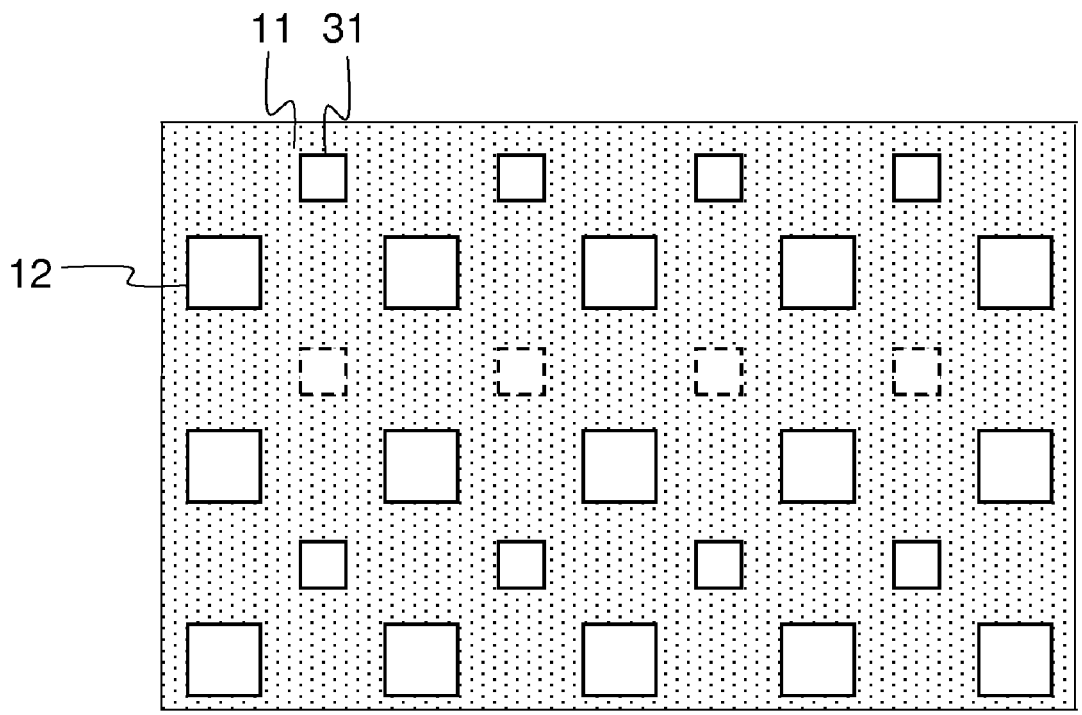
FIG. 10 illustrates one embodiment of a MOS transistor having rectangular transistor cells and rectangular feedback electrodes.

FIG. 10 illustrates a further example of a MOS transistor on the basis of a horizontal cross section through a semiconductor body 100. In the case of this transistor, the individual transistor cells have a rectangular geometry, that is to say that the body zones 12—and accordingly the source zones 13 (not illustrated)—are rectangular, especially square, in this component. It should be noted that such a rectangular geometry of the body zones 12 was chosen merely for explanation purposes. It goes without saying that the body zones 12 can also have any other geometry, and be for example circular, hexagonal or polygonal in any desired fashion. In the case of the MOS transistor illustrated in FIG. 10, the feedback electrodes 31 are pillar-type feedback electrodes having a rectangular, in one embodiment square, cross section in the example illustrated. It goes without saying that these pillar-type feedback electrodes 31 in accordance with FIG. 10 and also the pillar-type feedback electrodes in accordance with examples 8 and 9 explained above can also have a different cross section and be realized for example as circular or oval pillars or pillars having any desired polygonal geometry. In this case, a feedback electrode 31 can be assigned to each of the transistor cells. The transistor cells, on the one hand, and the feedback electrodes, on the other hand, are in this case arranged respectively in grid-type fashion, wherein the grids with the transistor cells and the grid with the feedback electrodes are arranged offset with respect to one another. The number of transistor cells corresponds to the number of feedback electrodes if a feedback electrode is assigned to each transistor cell. Furthermore, there is also the possibility of setting a ratio $k=n_R/n_T$ between the number $n_R$ of feedback electrodes 31 and the number $n_T$ of transistor cells such that it is less than 1. In this case, the feedback electrodes 31 can be arranged in a manner distributed as desired between the transistor cells in the drift zone 11.

Figure 11:
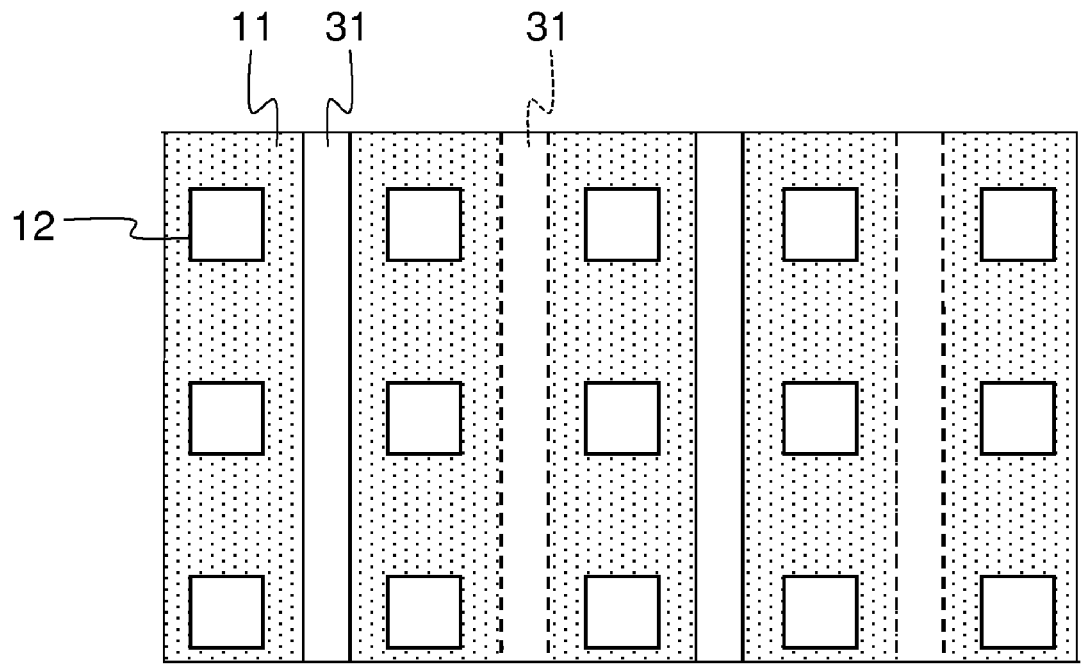
FIG. 11 illustrates one embodiment of a MOS transistor having rectangular transistor cells and strip-type feedback electrodes.

FIG. 11 illustrates an example of a MOS transistor. In the case of this transistor, the transistor cells have a rectangular geometry, but can of course also have a circular geometry, a hexagonal geometry or a geometry that is polygonal in any desired fashion. The feedback electrodes 31 are realized as strip-type electrodes in the case of this component. In this case, transistor cells and strip-type feedback electrodes can be arranged alternately in a direction of the transistor cell grid. Furthermore, there is also the possibility of distributing the feedback electrodes 31 such that a feedback electrode 31 is arranged, for example, only in every n-th interspace between adjacent transistor cells, as is illustrated on the basis of solid lines in FIG. 11. For a ratio $k=n_R/n_T$ between the number $n_R$ of feedback electrodes 31 and the number $n_T$ of transistor cells less than 1, the feedback electrodes 31 can also be arranged in a manner distributed as desired between the transistor cells in the drift zone 11.

Figure 12:
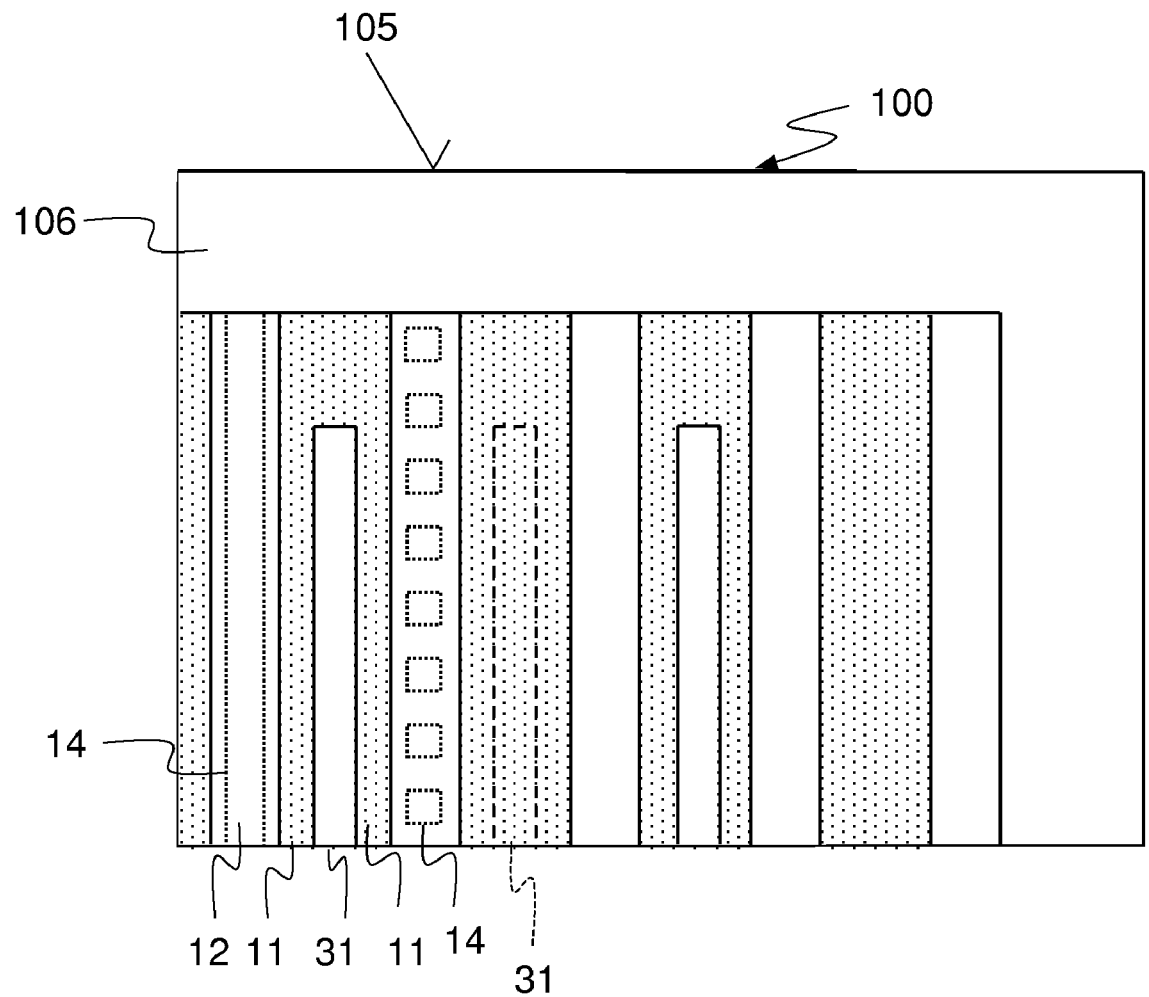
FIG. 12 illustrates one embodiment of an edge region of a MOS transistor.

In the exemplary embodiments in accordance with FIGS. 10 and 11, more highly doped drift zone sections 11' can be provided below the feedback electrodes in a manner not illustrated in more specific detail. These more highly doped drift zone sections 11' can have a pillar-type geometry or else a strip-type geometry, FIG. 12 illustrates a further embodiment of a MOS transistor on the basis of a horizontal cross section through a semiconductor 100. FIG. 12 illustrates the semiconductor body of this MOS transistor in the edge region. The edge region is that region of the semiconductor body 100 which is adjacent to an edge 105 of the semiconductor body 100 in a lateral direction. In the case of this component, it is provided that although the transistor cells or the body zones of the transistor cells 12 extend as far as the edge region 106, the feedback electrodes 31 are arranged at a distance from the edge region 106, that is to say do not extend in a lateral direction of the semiconductor body as far toward the edge region 106 towards the body zones 12. In the example illustrated in FIG. 12, the transistor cells and the feedback electrodes have a strip-type geometry. It goes without saying that other geometries from among the geometries explained above can also be provided for the transistor cells and the feedback electrodes.

In a further variant it is provided that the feedback electrodes extend closer to the edge region 106 of the semiconductor body than the transistor cells, the transistor cells in this case being realized such that the transistor cells arranged closest to the edge region have no source zones, that is to say are modified transistor cells.

A method for producing the trenches for the feedback electrodes is explained below with reference to FIGS. 13A to 13D. These figures illustrate this method on the basis of vertical cross sections through the semiconductor body 100 during different method processes. In this case, the figures illustrate the semiconductor body only in the region of the later drift zone 11.

Figure 13A:
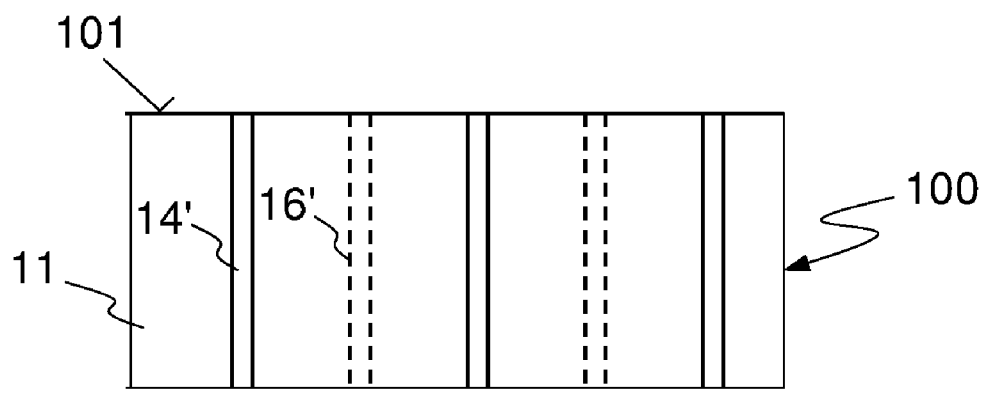
FIG. 13 illustrates one embodiment of a method for producing trenches for feedback electrodes.

Referring to FIG. 13A, the starting point is formed by providing the semiconductor body 100, in which a doped semiconductor zone of the first conduction type is adjacent to the front side 101, the semiconductor zone forming the later drift zone 11. Complementarily doped semiconductor zones 14' can be present in the semiconductor zone, and extend in a vertical direction of the semiconductor body 100 and form the later compensation zones 14. Optionally, doped semiconductor zones 16' which are of the first conduction type but are doped more highly than the later drift zone are present at a distance from the semiconductor zones 14' or adjacent to the semiconductor zones 14' (not illustrated). The semiconductor zones 16' likewise extend in a vertical direction of the semiconductor body 100 and form the later more highly doped drift zone sections 16 of the semiconductor component. The section of the semiconductor body with the semiconductor zones 14', 16' which is adjacent to the front side 101 of the semiconductor body 100 is an epitaxial layer, for example, in which the doped semiconductor zones 14', 16' can be produced as early as during the epitaxial growth. The semiconductor zones 14', 16' can—as illustrated—reach as far as the front side 101, but can also end at a distance from the front side in a vertical direction.

Figure 13B:
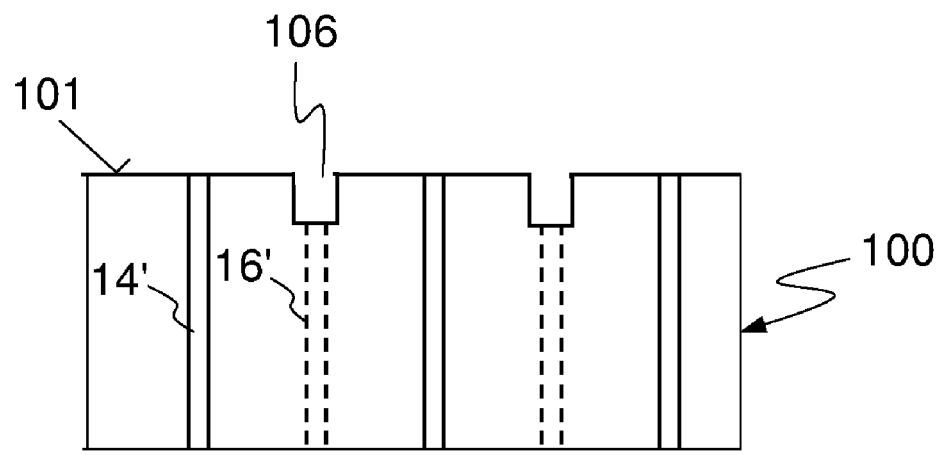

Referring to FIG. 13B, trenches 106 are produced in the semiconductor body 100 during further method processes, which trenches extend into the semiconductor body in a vertical direction proceeding from the front side 101 and form the basis for the trenches of the later feedback electrodes. The trenches 106 can be produced by sufficiently known method processes, such as, for example, by an etching method using an etching mask (not illustrated) which leaves the front side 101 free in sections in the regions in which the trenches 106 are intended to be produced.

If doped regions 16' of the first conduction type are present, then the trenches can be produced in one embodiment in such a way that the trenches are arranged above these doped regions 16', such that a part of these doped regions 16' is removed by the production of the trenches.

Figure 13C:
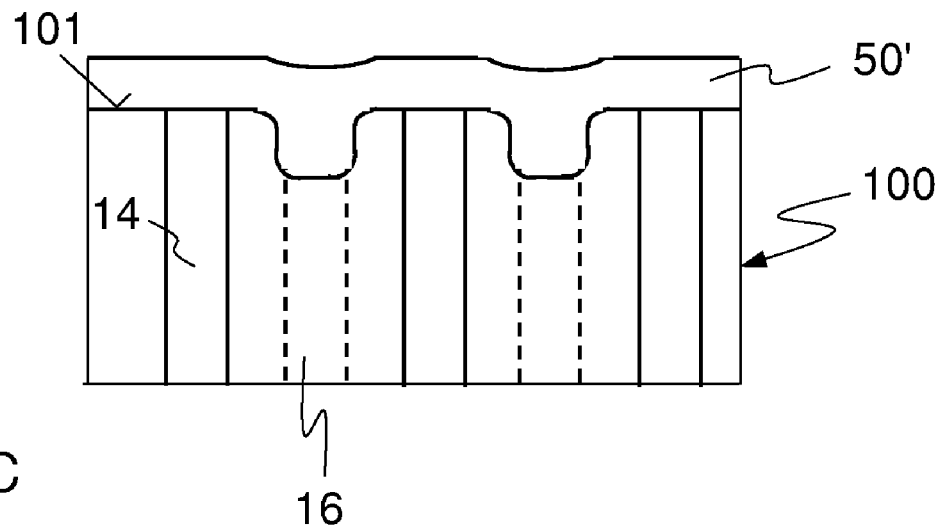

Referring to FIG. 13C, in further method processes, an oxide layer 50' is produced on the front side 101 and in the trenches 106. The oxide layer 50' is produced by thermal oxidation, for example, and can have a thickness such that it completely fills the trenches 106. In this case, the thickness of the oxide layer 50' is greater than half the trench width of the trenches 106. The thickness of the oxide can also be thinner than half the trench width. In this case, a residual trench (not illustrated) still remains after the production of the oxide layer. By using a thermal oxidation for producing the oxide layer 50', near the surface semiconductor material of the semiconductor body 100 is converted into an oxide under the influence of oxygen and temperature. This oxidation has the effect, inter alia, that edges of the trenches 106 are rounded, to be precise not only edges within the trenches 106 but also edges at the transition to the front side 101. The temperature during the oxidation additionally gives rise to (desirable) out-diffusion of dopant atoms from the semiconductor zone 14' doped complementarily with respect to the drift zone 11 and from the further doped semiconductor zones 16' optionally present, thereby giving rise to the compensation zones 14 and more highly doped sections 16 of the drift zone 11 as explained in connection with the previous figures.

Rounding of the edges of the trenches 106 in which the feedback electrodes 31 subsequently arise is desirable insofar as owing to the geometry of the trenches, the later feedback electrode 31 does not have any sharp edges either. As a result, it is possible to avoid field spikes in the region of the feedback electrode if a reverse voltage is present at the finished component during operation.

Figure 13D:
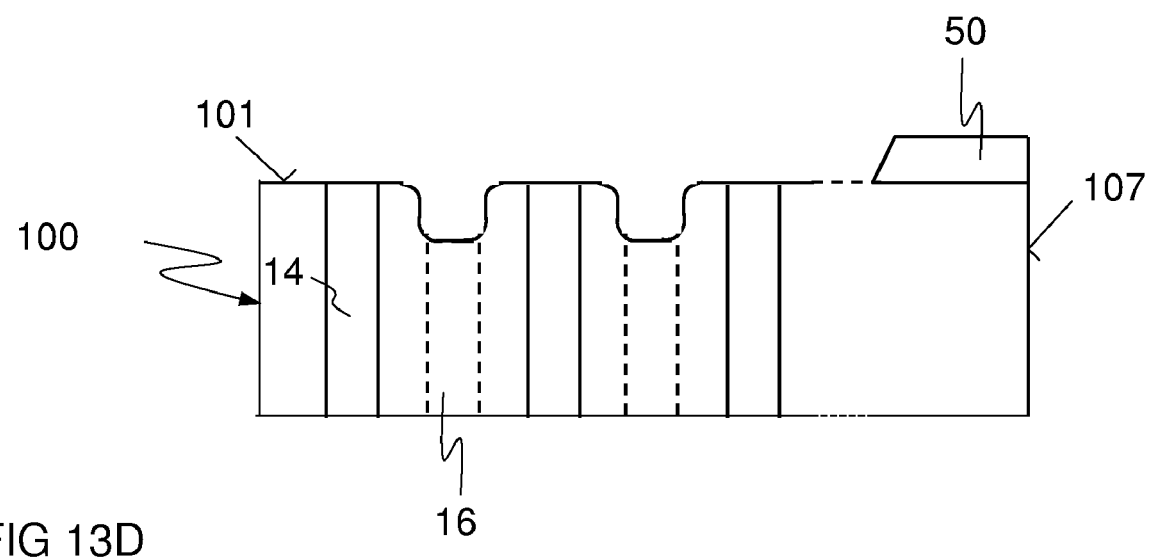

Referring to FIG. 13D, the oxide layer 50' is removed from the front side 101 and from the trenches 106 in the region of the later transistor cell array, but remains on the front side 101 in the region of an edge 107 of the semiconductor body 100. The remaining section of the oxide layer 50 forms a passivation layer in the edge region of the later component. In addition to this passivation layer, conventional edge termination structures such as e.g., field rings or VLD zones (not illustrated) can also be provided in the edge region. The removal of the oxide layer 50' in the region of the later transistor cell array is effected, for example, by using a masked etching method using an etching mask that covers the edge regions of the semiconductor body 100.

After the production of the trenches for the feedback electrodes, it is possible to carry out customary method processes for producing the transistor cell array, thus resulting overall in the component structure explained with reference to FIG. 1, with the difference that the feedback electrode 31 in FIG. 1 is illustrated schematically as a rectangular electrode in cross section, while a feedback electrode with rounded corners results during the production of a transistor cell array on the basis of the component structure illustrated with reference to FIG. 13D.

Method processes for producing the transistor cell array include for example: producing a dielectric layer on the front side 101 and in the trenches 106, which forms the gate dielectric 22 and the feedback dielectric 32; producing an electrode layer on the dielectric layer, to be precise above the front side 101 and in the trenches, which forms the gate electrode 21 and the feedback electrode 31; producing contact holes in the electrode layer and the dielectric layer above the compensation zones 14, which reach as far as or into the semiconductor body 100; implanting or diffusing dopant atoms of the second conduction type via the contact holes into the semiconductor body 100 in order to produce the body zones 12; implanting or diffusing dopant atoms of the first conduction type via the contact holes into the semiconductor body 100 in order to produce the source zones 13; producing a further electrode layer, which is insulated from the first electrode layer by a further dielectric layer and which forms the source electrode 41.

Before the source electrode 41 is produced, the contact holes can be extended further into the semiconductor body 100, such that the source electrode 41, as illustrated in FIG. 1, makes contact with the source zones 13 and the body zones 12. The first electrode layer, which forms the gate electrodes 21 and the feedback electrodes 31, can be realized in such a way that it completely fills the trenches, such that the feedback electrodes 31—as illustrated in FIG. 1—completely fill the trench. In a manner not illustrated in more specific detail, there is also the possibility of producing the feedback electrodes 31 in such a way that they are only arranged in the region of the sidewalls and bottom of the trench. A region of the trench which remains after the production of the feedback electrode 31 is then filled with a dielectric layer. Referring to FIG. 1, that is the dielectric layer which is arranged between the gate electrode 21 or feedback electrode 31 and the source electrode 41 and which is designated by the reference symbol 23.

Finally, it should be pointed out that features which were explained above in connection with just one example can be combined with features of other examples even if this was not explicitly mentioned. Thus, in one embodiment, features of the claims specified below can be combined with one another as desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A MOS transistor comprising:
   a drift zone of a first conduction type;
   at least one transistor cell having a body zone, a source zone separated from the drift zone by the body zone, and a gate electrode, arranged adjacent to the body zone and dielectrically insulated from the body zone by a gate dielectric;
   at least one compensation zone of a second conduction type arranged in the drift zone; and
   at least one feedback electrode arranged at a distance from the body zone, dielectrically insulated from the drift zone by a feedback dielectric and electrically conductively connected to the gate electrode,
   wherein the compensation zone has a first compensation zone section and a second compensation zone section, wherein the first compensation zone section is doped more highly than the second compensation zone section and is arranged nearer to the feedback electrode than the second compensation zone section.

2. The MOS transistor of claim 1, wherein a respective feedback electrode is assigned to at least some of the transistor cells.

3. The MOS transistor of claim 2, wherein a degree of compensation is determined by the ratio of charge carriers of the first and of the second conduction type in regions, for the semiconductor body, comprising sections of the drift zone and of the body zone or compensation zone, wherein the degree of compensation in the region of those transistor cells to which a feedback electrode is assigned differs from the degree of compensation in the region of those transistor cells to which no feedback electrode is assigned.

4. The MOS transistor of claim 3, comprising:
   a compensation zone assigned to each transistor cell,
   wherein the compensation zones of those transistor cells to which a feedback electrode is assigned have a first compensation zone section and a second compensation zone section, and
   wherein the first compensation zone section is doped more highly than the second compensation zone section and is arranged nearer to the feedback electrode than the second compensation zone section.

5. A MOS transistor comprising:
   a drift zone of a first conduction type;
   at least one transistor cell having a body zone, a source zone separated from the drift zone by the body zone, and a gate electrode, arranged adjacent to the body zone and dielectrically insulated from the body zone by a gate dielectric;
   at least one compensation zone of a second conduction type arranged in the drift zone;
   at least one feedback electrode arranged at a distance from the body zone, dielectrically insulated from the drift zone by a feedback dielectric and electrically conductively connected to the gate electrode;
   a plurality of transistor cells arranged at a distance from one another; and
   a first number of transistor cells and a second number of feedback electrodes,
   wherein the second number is greater than the first number.

6. The MOS transistor of claim 1, wherein the feedback dielectric and the gate dielectric are identical with regard to material composition and their thickness.

* * * * *